United States Patent
Huang et al.

(10) Patent No.: US 9,240,459 B2
(45) Date of Patent: Jan. 19, 2016

(54) SEMICONDUCTOR PROCESS

(71) Applicant: UNITED MICROELECTRONICS CORP., Hsin-Chu (TW)

(72) Inventors: Kuang-Hung Huang, Tainan (TW); Jie-Ning Yang, Pingtung County (TW); Yao-Chang Wang, Tainan (TW); Chi-Sheng Tseng, Tainan (TW); Po-Jui Liao, Taichung (TW); Shih-Chang Chang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 213 days.

(21) Appl. No.: 13/773,635

(22) Filed: Feb. 22, 2013

(65) Prior Publication Data

US 2014/0242770 A1 Aug. 28, 2014

(51) Int. Cl.
*H01L 29/66* (2006.01)
*H01L 21/768* (2006.01)
*H01L 29/49* (2006.01)
*H01L 29/51* (2006.01)

(52) U.S. Cl.
CPC .... *H01L 29/66545* (2013.01); *H01L 21/76801* (2013.01); *H01L 21/76834* (2013.01); *H01L 29/4966* (2013.01); *H01L 29/517* (2013.01); *H01L 29/6653* (2013.01)

(58) Field of Classification Search
None
See application file for complete search history.

(56) References Cited

U.S. PATENT DOCUMENTS

| | | | |
|---|---|---|---|
| 7,410,854 B2 * | 8/2008 | Yao et al. | 438/197 |
| 8,048,752 B2 | 11/2011 | Wu | |
| 2007/0042583 A1 * | 2/2007 | Jang et al. | 438/585 |
| 2010/0078728 A1 | 4/2010 | Li | |
| 2010/0112798 A1 | 5/2010 | Lai | |
| 2010/0148269 A1 | 6/2010 | Yelehanka | |
| 2012/0025329 A1 | 2/2012 | Wu | |
| 2012/0126331 A1 | 5/2012 | Lin | |

* cited by examiner

*Primary Examiner* — Alexander Ghyka
(74) *Attorney, Agent, or Firm* — Winston Hsu; Scott Margo

(57) ABSTRACT

A semiconductor process includes the following step. A stacked structure is formed on a substrate. A contact etch stop layer is formed to cover the stacked structure and the substrate. A material layer is formed on the substrate and exposes a top part of the contact etch stop layer covering the stacked structure. The top part is redressed.

19 Claims, 5 Drawing Sheets

SEMICONDUCTOR PROCESS

BACKGROUND OF THE INVENTION

1. Field of the Invention

The present invention relates generally to a semiconductor process, and more specifically to a semiconductor process that redresses a contact etch stop layer.

2. Description of the Prior Art

As the integration of layouts of integrated circuits increases, the spacings between each of its semiconductor components shrink. Thus, structural defects and processing difficulties of the semiconductor components occur because of the processing limitations such as physical limitations. For example, as the spacings between a plurality of transistors shrink, the filling of an interdielectric layer becomes difficult because of too small spacings between the transistors. In nowadays processes, some processing steps may further be added to the semiconductor processes, such as removing spacers on a substrate beside gates for defining source/drains or epitaxial structures, or removing cap layers on the gates for being used as masks while etching, to improve aforesaid problems. However, these processing steps are complex and some problems may occur like when other parts of the semiconductor components such as gates may be damaged or polluted, which would degrade the electrical performances of the formed semiconductor component such as the reliability.

SUMMARY OF THE INVENTION

The present invention provides a semiconductor process, which redresses a contact etch stop layer to simplify processes and improve the filling of openings of an interdielectric layer so as to avoid structural defects degrading electrical performances.

The present invention provides a semiconductor process including the following steps. A stacked structure is formed on a substrate. A contact etch stop layer is formed to cover the stacked structure and the substrate. A material layer is formed on the substrate but exposes a top part of the contact etch stop layer covering the stacked structure. The top part is redressed.

According to the above, the present invention provides a semiconductor process, which redresses a top part of a contact etch stop layer by performing an etching process once to change the cross-sectional profile of the layout of the formed semiconductor structure. In this way, the photolithography processes in the prior art can be simplified, and an interdielectric layer between stacked structures can be filled easily, thereby reducing the processing times of deposition processes for forming it. Moreover, the problems caused by removing or etching spacers or cap layers in the prior art can be avoided in the present invention. For instance, the uneven heights of electrode layers, leading to residues of electrode layer or defects of metal gates after replacement a metal gate process is performed, problems of other parts of the formed semiconductor structure being removed or polluted, can all be avoided.

These and other objectives of the present invention will no doubt become obvious to those of ordinary skill in the art after reading the following detailed description of the preferred embodiment that is illustrated in the various figures and drawings.

DETAILED DESCRIPTION

A gate-last for high-K last process is applied in later embodiments, but a gate-last for high-K first process or other semiconductor processes can also be applied in the present invention.

Figure 1:
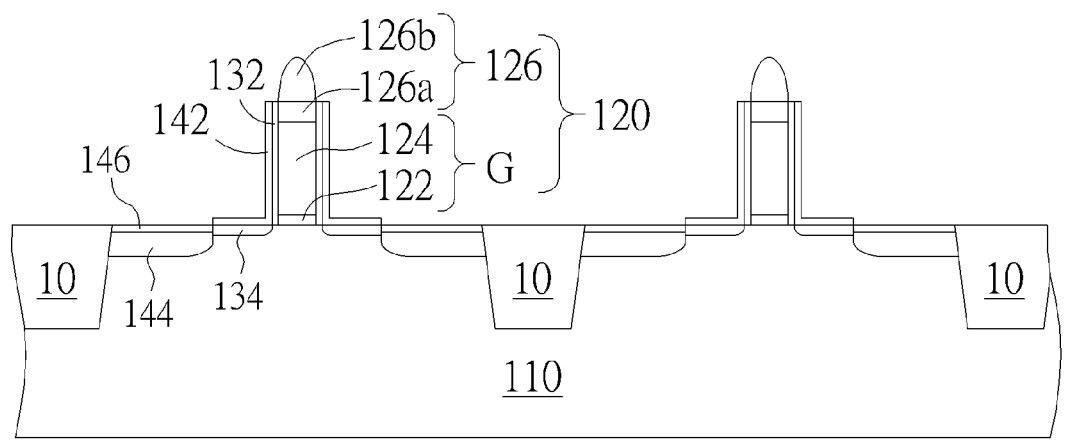
FIGS. 1-10 schematically depict cross-sectional views of a semiconductor process according to an embodiment of the present invention.

FIGS. 1-10 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A plurality of isolation structures 10 is formed in the substrate 110, wherein the isolation structures may be shallow trench isolation structures, which may be formed by a shallow trench isolation process, but they are not limited thereto. Two stacked structures 120 are formed on the substrate 110, which are electrically isolated from each other thanks to the isolation structures 10. In this embodiment, the stacked structure 120 includes a gate G and a cap layer 126 from bottom to top, wherein the gate G may include a dielectric layer 122 and an electrode layer 124 from bottom to top, but it is not limited thereto. The dielectric layer 122 may be an oxide layer, which may be formed through a thermal oxide process or a chemical oxide process etc. The electrode layer 124 may be a silicon layer. Since a gate-last for high-K last process is applied in this embodiment, the electrode layer 124 is a sacrificial electrode layer, which may be replaced by a metal gate through a replacement metal gate (RMG) process. The cap layer 126 may include a single layer or a dual layer, and may be composed of a nitride layer or/and an oxide layer etc. In this embodiment, the cap layer 126 is a dual layer including a nitride layer 126a and an oxide layer 126b from bottom to top.

A liner (not shown) may be selectively formed on the substrate 110 beside each of the stacked structures 120, wherein the liner (not shown) may be a nitride layer, an oxide layer or an oxynitride layer etc. For simplifying and clarifying the present invention and to emphasize the effect of a redressed contact etch stop layer, only two stacked structures 120 are depicted in the figures, but the number of the stacked structures 120 is not restricted thereto. In another embodiment, the number of stacked structures 120 may be one or more than two.

Please refer to FIG. 1 again; a first spacer 132 is formed on the substrate 110 beside each stacked structure 120 to define the positions of lightly doped source/drains in the substrate 110 beside the first spacers 132. Two lightly doped source/drains 134 are formed in the substrate 110 beside the two first spacers 132 respectively, wherein the dopants of the lightly doped source/drains 134 may be trivalent ions such as boron or pentavalent ions such as phosphorus, depending upon practical needs.

A second spacer (not shown) may be formed on the substrate 110 beside each first spacer 132. The second spacer (not shown) may be a single layer spacer or a multilayer spacer such as a dual layer spacer, and its cross-sectional profile depends upon practical needs and processing steps. In this embodiment, the second spacer (not shown) may be a dual layer spacer having an inner spacer 142 and an outer spacer (not shown). More precisely, an inner spacer material layer (not shown) and an outer spacer material layer (not shown) are sequentially formed to entirely cover the substrate 110 and the gate G, and then are patterned to form the inner spacer 142 and the outer spacer (not shown). Due to the inner spacer 142 and the outer spacer (not shown) being sequentially formed and then being patterned, the inner spacer 142 has an L-shaped cross-sectional profile. A source/drain 144 is formed in the substrate 110 beside each of the second spacers (not shown), wherein the dopants of the source/drains 144 may be trivalent ions such as boron or pentavalent ions such as phosphorus, depending upon practical needs. Thereafter, a metal silicide 146 is formed on each of the source/drain 144, wherein the metal silicide 146 may be nickel silicide but not limited to. An etching process may be performed to remove the outer spacer but keep the inner spacer 142 by using the inner spacer 142 as an etch stop layer.

Figure 2:
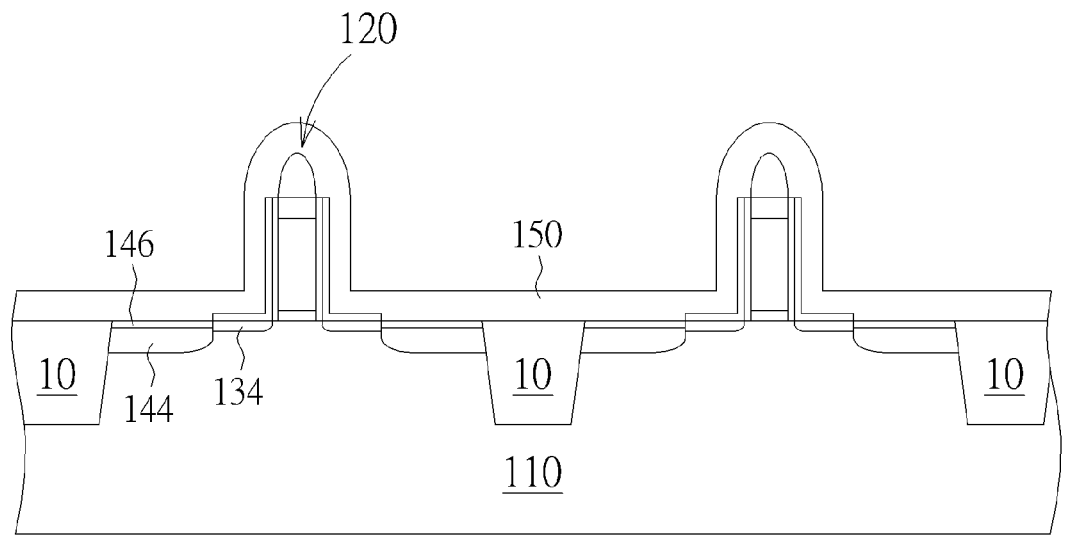

As shown in FIG. 2, a contact etch stop layer 150 is formed to cover the stacked structures 120 and the substrate 110. The contact etch stop layer 150 may be a nitride layer or a doped nitride layer having a capability of inducing stresses in the substrate 110 under the stacked structures 120, but it is not limited thereto.

Figure 3:
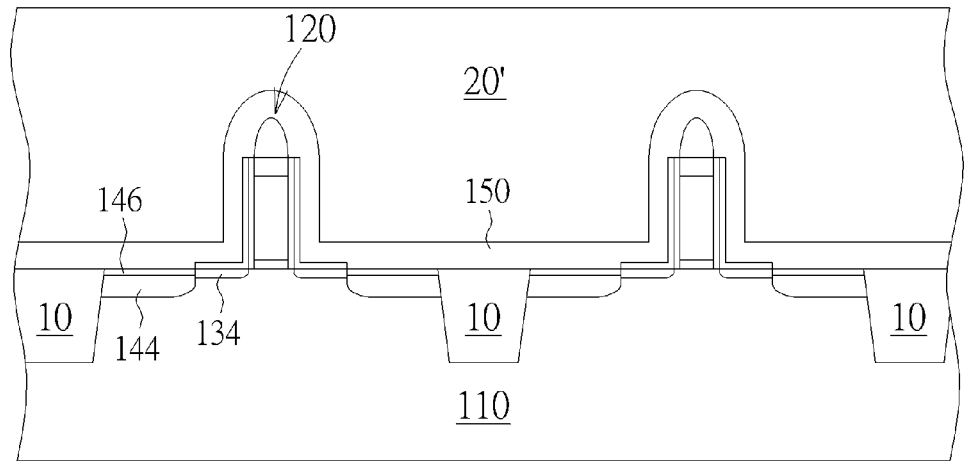
Figure 4:
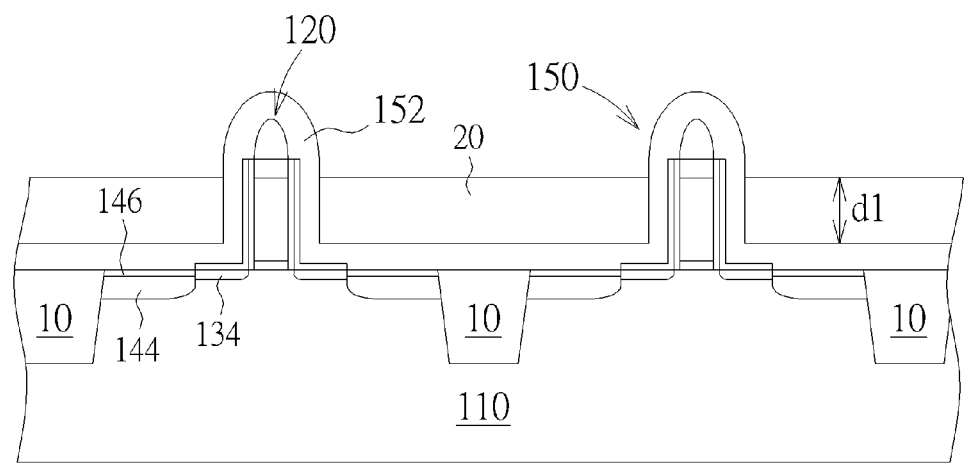

As shown in FIGS. 3-4, a material layer 20 is formed on the substrate 110 but exposing a top part 152 of the contact etch stop layer 150 covering the stacked structures 120. More precisely, as shown in FIG. 3, a material 120' is formed to entirely cover the contact etch stop layer 150. In this embodiment, the material 20' is a photoresist material; in another embodiment, the material 20' is an oxide layer, but it is not limited thereto. Then, the material 20' is etched back to form the material layer 20, as shown in FIG. 4. In this embodiment, the material 20' is etched back until the top part 152 of the contact etch stop layer 150 desired to be redressed in later performed processes is exposed, wherein parts of the stacked structures 120 and the top part 152 of the contact etch stop layer 150 covering the stacked structures 120 preferably protrude from the material layer 20. The depth d1 of the material layer 20 depends upon the top part 152 of the contact etch stop layer 150; in other words, the contact etch stop layer 150 covered by the material layer 20 (i.e. other parts of the contact etch stop layer 150 except the top part 152) will not be etched, therefore the profile of the contact etch stop layer 150 after being redressed can be controlled by adjusting the depth d1 of the material layer 20. Moreover, a photolithography process may be selectively performed before the material layer 20 is formed by etching back the material 20' to etch part of the material 20' in larger areas, enabling the thickness of the material 20' in larger areas being thinner than the thickness of the material 20' in smaller areas, so the material layer 20 formed by etching back the material 20' can have an uniform thickness.

Figure 5:
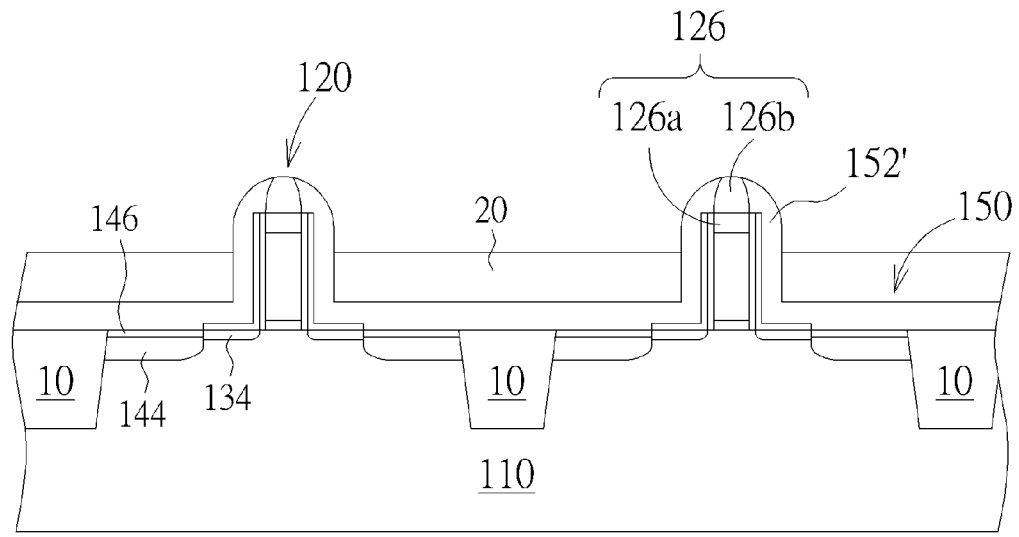
Figure 6:
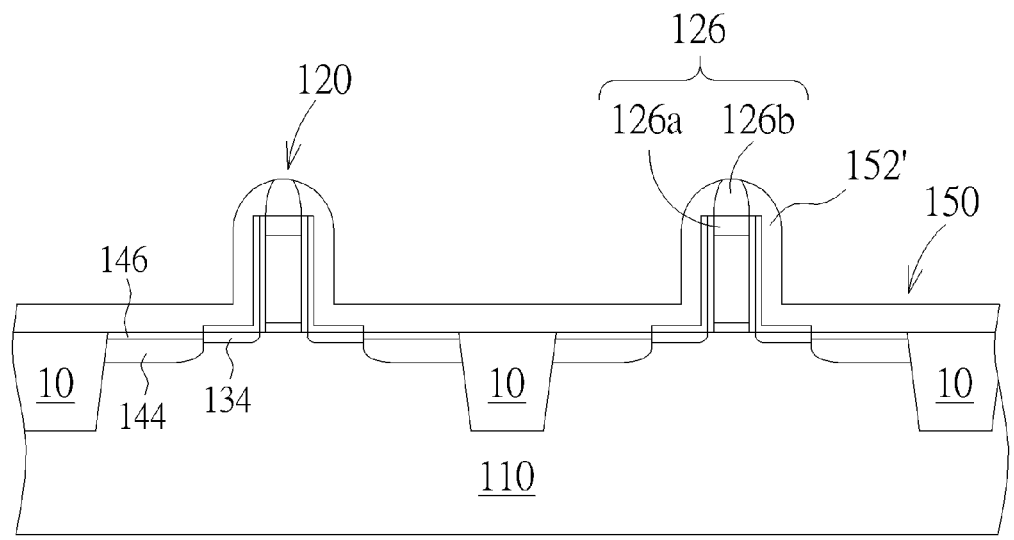

Then, the top part 152 protruding from the material layer 20 can be redressed, and a top part 152' can therefore be formed as shown in FIG. 5. In this embodiment, the top part 152 is redressed until the oxide layer 126b is exposed without exposing the nitride layer 126a, but it is not limited thereto. In another embodiment, the top part 152 may be redressed until other parts such as the nitride layer 126a is exposed. No matter which embodiment is applied, the gates G of the stacked structures 120 will not be exposed during the redressing step and the top part 152' and parts of the stacked structures 120 will still protrude from the material layer 20 after redressing. Since the material layer 20 is a photoresist layer in this embodiment, the material layer 20 will be removed after the top part 152' is formed and the contact etch stop layer 150 is therefore exposed apart from the top part 152', as shown in FIG. 6. In another embodiment, the material layer 20 may be an oxide layer, and is not to be removed, so that an interdielectric layer having a material similar or identical to the material of the material layer 20 may be directly formed thereon.

According to the above, the cross-sectional profile of the layout of semiconductor structures such as transistors can be changed by redressing the top part 152 of the contact etch stop layer 150 in the present invention. The cross-sectional profile of the layout of semiconductor structures can therefore be changed by performing an etching process once. Compared to the prior art, which performs processes many times to remove or etch spacers or cap layers, the method of redressing the contact etch stop layer 150 of the present invention will not cause any derivative problems such as the electrode layer 124 that may be damaged during etching processes, leading to unequal heights of the electrode layers 124, resulting in defects of later formed metal gates or residues of silicon sacrificial gate, or parts of the structures such as metal silicides that may be lost while removing the spacer or the cap layer, and these lost parts may further pollute other parts of the structures.

Figure 7:
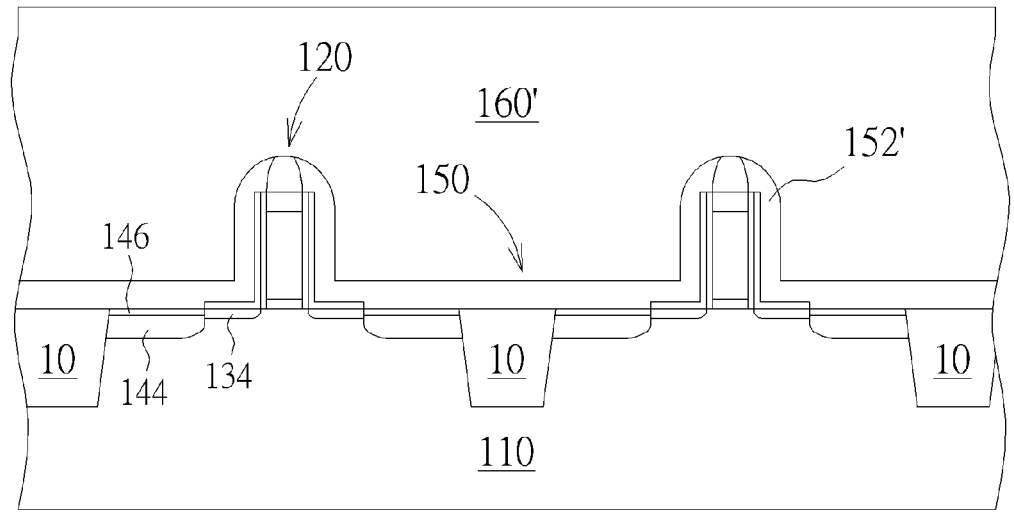
Figure 8:
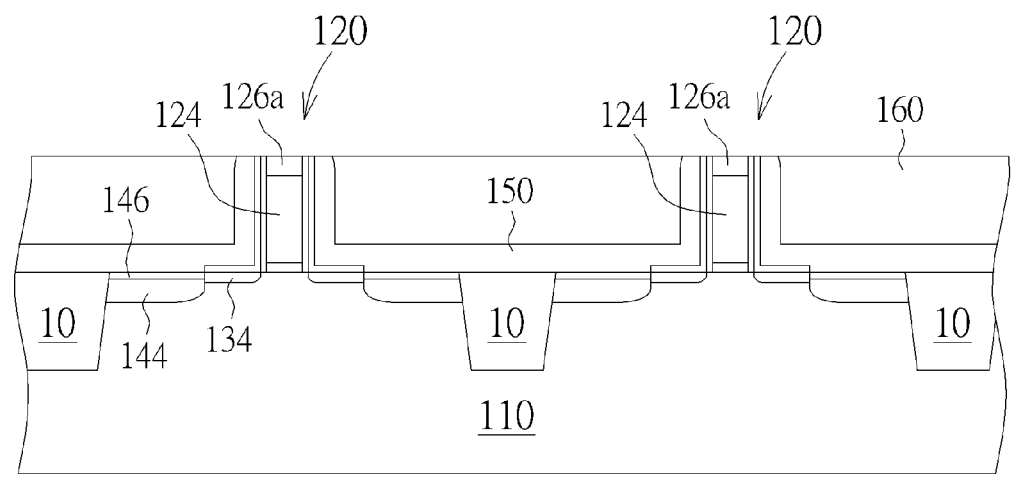

As shown in FIGS. 7-8, a planarized interdielectric layer 160 is formed on the substrate 110 but exposes the stacked structures 120. More precisely, as shown in FIG. 7, an interdielectric layer 160' is formed to cover the contact etch stop layer 150. The interdielectric layer 160' may be an oxide layer, which may be formed by a single process or multiple processes such as a plasma-enhanced chemical vapor deposition (PECVD) process or a thermal oxide process. Since the top part 152 of the contact etch stop layer 150 is redressed in the present invention, the interdielectric layer 160' having a desired depth can be obtained by performing a deposition process once, but it is not limited thereto. Then, the interdielectric layer 160' is planarized by processes such as an etching back processes or a chemical mechanical polishing process until the stacked structures 120 are exposed, and the planarized interdielectric layer 160 is therefore formed, as shown in FIG. 8. In this embodiment, the interdielectric layer 160' is etched back until the oxide layer 126b is removed but the nitride layer 126a is kept, thereby preventing the electrode layer 124 below the nitride layer 126a from being damaged during back etching. The nitride layer 126a is then removed to expose the electrode layer 124, wherein the nitride layer 126a may be etched with a lower etching rate or by an etching process that can control the etching depth easily and not etch the electrode layer 124. In another embodiment, the interdielectric layer 160' may be etched back until the oxide layer 126b is removed and the nitride layer 126a is removed and the electrode layer 124 is exposed, wherein the exposing depths of the stacked structures 120 depend upon practical needs. It is emphasized that the top part 152 of the contact etch stop layer 150 is redressed to be a circular top part, thereby reducing the height of its profile. Therefore, the interdielectric layer 160' can be filled between the stacked structures 120 without generating voids.

Figure 9:
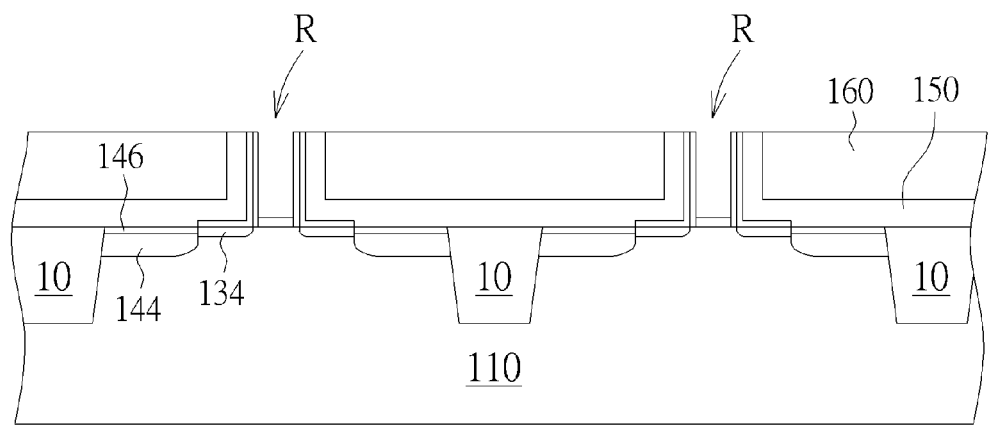
Figure 10:
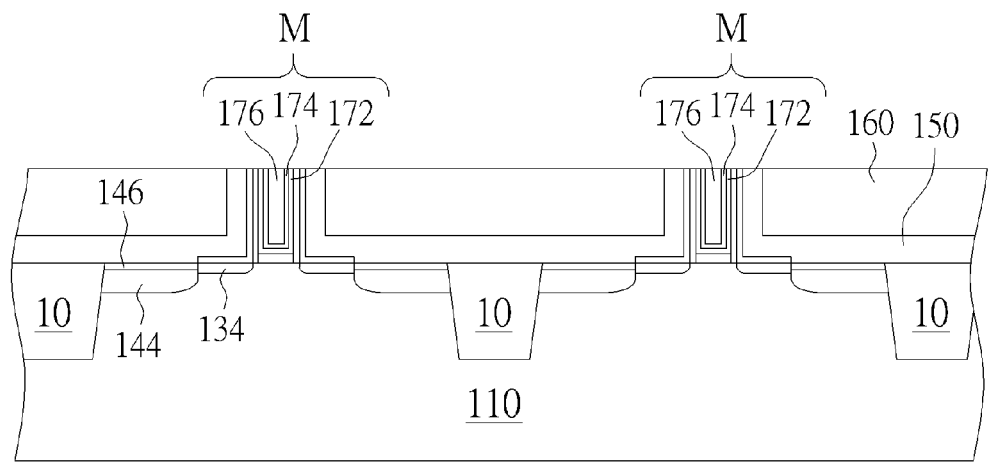

Thereafter, a replacement metal gate (RMG) process is performed. Due to a gate-last for high-K last process being applied, the electrode layer 124 and the dielectric layer 122 are removed to form recesses R and the substrate 110 below it is therefore exposed, as shown in FIG. 9. Then, a selective buffer layer (not shown), a dielectric layer having a high dielectric constant 172, a selective barrier layer (not shown), a work function layer 174 and a low resistivity material 176 may be formed in and fill each of the recesses R, thereby forming metal gates M. More precisely, the step of forming the metal gates M may include the following steps. A selective buffer layer (not shown), a dielectric layer having a high dielectric constant (not shown), a selective barrier layer (not shown), a work function layer (not shown) and a low resistivity material (not shown) are sequentially formed to cover the two recesses R and the planarized interdielectric layer 160 entirely; then, the low resistivity material (not shown), the work function layer (not shown), the selective barrier layer (not shown), the dielectric layer having a high dielectric constant (not shown) and the selective barrier layer (not shown) are planarized to form the two metal gates M.

In addition, a gate-last for high-k first process may be applied, so the dielectric layer 122 may include a selective barrier layer and a dielectric layer having a high dielectric constant, and only the electrode layer 124 is removed and replaced by a work function layer 174 and a low resistivity material 176. Moreover, the present invention may also be applied into a gate-first process or a polysilicon gate process.

The selective barrier layer may be an oxide layer, which may be a thermal oxide process or a chemical oxide process; the dielectric layer having a high dielectric constant 172 may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The selective barrier layer (not shown) may be a stacked structure composed of titanium nitride (TiN) or tantalum nitride (TaN). The work function layer 174 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN). The low resistivity material 176 may be composed of low resistivity materials such as aluminum, tungsten, titanium aluminum (TiAl) alloy, cobalt tungsten phosphide (CoWP).

To summarize, the present invention provides a semiconductor process, which redresses a top part of a contact etch stop layer by performing an etching process once to change the cross-sectional profile of the layout of the formed semiconductor structures. In this way, the processing time of the photolithography processes can be simplified while achieving the same purpose like the prior art, meaning that an interdielectric layer can be filled between stacked structures such as gates without incomplete filling and voids generation. The depth of the interdielectric layer can therefore be obtained by performing a deposition process only once. Moreover, the problems caused by removing or etching spacers or cap layers in the prior art can be avoided in the present invention, such as the unequal heights of electrode layers caused by etching, leading to parts of the electrode layers remaining or defects of metal gates after a replacement metal gate process is performed, or parts of the formed semiconductor structures that do not need to be removed, such as a metal silicide, that may be removed by etching processes, and these parts may further pollute other parts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   forming a stacked structure on a substrate;
   covering a contact etch stop layer on the stacked structure and the substrate;
   forming a material layer on the substrate and exposing a top part of the contact etch stop layer covering the stacked structure, wherein the top part protrudes from the material layer; and
   redressing the top part after the material layer is formed.

2. The semiconductor process according to claim 1, wherein the stacked structure comprises a gate and a cap layer from bottom to top.

3. The semiconductor process according to claim 2, wherein the top part is redressed until a part of the cap layer is exposed.

4. The semiconductor process according to claim 2, wherein the cap layer comprises a dual layer.

5. The semiconductor process according to claim 4, wherein the cap layer comprises a nitride layer and an oxide layer from bottom to top.

6. The semiconductor process according to claim 5, wherein the top part is redressed until part of the oxide layer is exposed without exposing the nitride layer.

7. The semiconductor process according to claim 1, wherein the step of forming the material layer on the substrate and exposing the top part of the contact etch stop layer covering the stacked structure comprises:
   entirely covering a material on the contact etch stop layer; and
   etching back the material to form the material layer.

8. The semiconductor process according to claim 1, wherein the material layer comprises a photoresist layer or an oxide layer.

9. The semiconductor process according to claim 8, further comprising:
   removing the photoresist layer after the top part is redressed.

10. The semiconductor process according to claim 2, further comprising:
    forming a planarized interdielectric layer on the substrate but exposing the stacked structure after the top part is redressed.

11. The semiconductor process according to claim 10, wherein the step of forming the planarized interdielectric layer comprises:
    forming an interdielectric layer to cover the substrate and the stacked structure; and
    planarizing the interdielectric layer until the stacked structure is exposed.

12. The semiconductor process according to claim 11, wherein the interdielectric layer is planarized until the cap layer is removed and the gate is exposed.

13. The semiconductor process according to claim 11, wherein the cap layer comprises a nitride layer and an oxide layer from bottom to top, and the interdielectric layer is planarized until the oxide layer is removed and the nitride layer is exposed.

14. The semiconductor process according to claim 13, further comprising:
    performing an etching process to remove the nitride layer after the oxide layer is removed.

15. The semiconductor process according to claim 10, further comprising:
    removing the gate after the planarized interdielectric layer is formed.

16. The semiconductor process according to claim 2, further comprising:
    replacing the gate by a metal gate after the top part is redressed.

17. The semiconductor process according to claim 1, further comprising:
    forming a first spacer on the substrate beside the stacked structure after the stacked structure is formed.

18. The semiconductor process according to claim 1, further comprising:
    forming a metal silicide on the substrate beside the stacked structure before the contact etch stop layer is covered.

19. The semiconductor process according to claim 1, further comprising:
   forming a second spacer on the substrate beside the stacked structure before the contact etch stop layer is covered;
   forming a source/drain in the substrate beside the second spacer; and
   removing at least a part of the second spacer.

* * * * *